United States Patent [19]

Asakawa et al.

[11] Patent Number: 5,400,001
[45] Date of Patent: Mar. 21, 1995

[54] PIEZOELECTRIC RESONATOR AND PIEZOELECTRIC FILTER

[75] Inventors: Yasuteru Asakawa, Neyagawa; Toshio Ishizaki, Kobe; Yukihiko Ise, Toyonaka; Hiroshi Fukushima, Katano; Yukio Kashiwagi, Takarazuka; Tomoki Uwano, Hirakata, all of Japan

[73] Assignee: Matsushita Electric Industrial Co., Ltd., Japan

[21] Appl. No.: 123,468

[22] Filed: Sep. 20, 1993

[30] Foreign Application Priority Data

Sep. 21, 1992 [JP] Japan .................. 4-251015
Jan. 19, 1993 [JP] Japan .................. 5-006776
Apr. 19, 1993 [JP] Japan .................. 5-091105

[51] Int. Cl.⁶ ............................................. H03H 9/15
[52] U.S. Cl. ............................. 333/186; 310/357; 310/367; 333/188; 333/189
[58] Field of Search ................... 333/187–192; 310/357, 367, 368

[56] References Cited

U.S. PATENT DOCUMENTS

| | | | |
|---|---|---|---|
| 3,694,676 | 9/1972 | De Vries | 333/187 |
| 4,379,247 | 4/1983 | Mattuschka | 310/368 |
| 4,398,162 | 8/1983 | Nagai | 333/190 |

FOREIGN PATENT DOCUMENTS

| | | | |
|---|---|---|---|
| 50-67054 | 6/1975 | Japan . | |
| 51-10678 | 3/1976 | Japan . | |
| 52-120740 | 10/1977 | Japan . | |
| 55-96416 | 1/1979 | Japan . | |
| 55-138824 | 10/1980 | Japan . | |
| 56-40316 | 4/1981 | Japan . | |
| 0146121 | 8/1983 | Japan | 333/191 |
| 0154211 | 7/1986 | Japan | 333/191 |
| 0187907 | 8/1988 | Japan | 333/187 |
| 0046808 | 2/1991 | Japan | 333/191 |
| 0226106 | 10/1991 | Japan | 333/187 |

*Primary Examiner*—Robert J. Pascal
*Assistant Examiner*—Darios Gambino
*Attorney, Agent, or Firm*—Parkhurst, Wendel & Rossi

[57] ABSTRACT

In a piezoelectric resonator having a piezoelectric bar formed in a substantial rectangular parallelopiped and electrodes formed on a pair of confronting surfaces of the piezoelectric bar for resonating in the length expander mode, the piezoelectric bar has at least a bevel portion extending the longitudinal direction. In a ladder filter having series and parallel piezoelectric resonators, the series piezoelectric resonator has the bevel portion to shift a frequency of a spurious response to that of the parallel piezoelectric resonator to suppress the spurious response. It is disclosed that a second piezoelectric resonator has a piezoelectric bar formed in a rectangular parallelopiped has a length L, a width W, and a thickness T wherein $L > W > T$; and electrodes formed on a pair of confronting surfaces defined by L and T. Another ladder filter includes the second piezoelectric resonator as the series resonator to decrease a capacitance between the electrodes to increase an amount of attenuation. In the second piezoelectric resonator, when $W < T$ and $0.42 < T/L < 2.5$, a coupling factor is large.

24 Claims, 10 Drawing Sheets

LADDER FILTER

PIEZOELECTRIC RESONATOR AND PIEZOELECTRIC FILTER

BACKGROUND OF THE INVENTION

1. Field of the Invention

This invention relates to a piezoelectric resonator used for an intermediate frequency filter or an oscillator in a radio apparatus and a piezoelectric filter using this piezoelectric resonator.

2. Description of the Prior Art

Piezoelectric resonators used for conversion between a mechanical energy and an electric energy are widely known. A rectangular bar type piezoelectric resonator using the length expander mode and a ladder filter including such piezoelectric resonators are disclosed in Japanese utility model application provisional publication No. 55-138824. Such a prior art ladder filter comprises a plurality of stages of resonator circuits, each stage including a resonator connected in series (hereinafter referred to as a series resonator) and a resonator connected in parallel (hereinafter referred to as a parallel resonator). A passband of this ladder filter is obtained by agreement between a resonance frequency of the series resonator and an antiresonance frequency of the parallel resonator and maximum elimination bands are provided on the both sides of the passband. An amount of attenuation of this ladder filter is increased by increase in the number of stages and by increase in a ratio of capacitances between the series resonator and the parallel resonator. That is, to increase the amount of attenuation, the capacitance in the series resonator is made small by forming a partial electrode covering a surface of rectangular bar of the series resonator partially. Moreover, to increase the amount of the attenuation, namely, to reduce the capacitance in the series resonator, piezoelectric materials having different coupling factors or different dielectric constants should be used. This technique is disclosed in Japanese patent application provisional publication No. 50-67054.

Figure 7A:
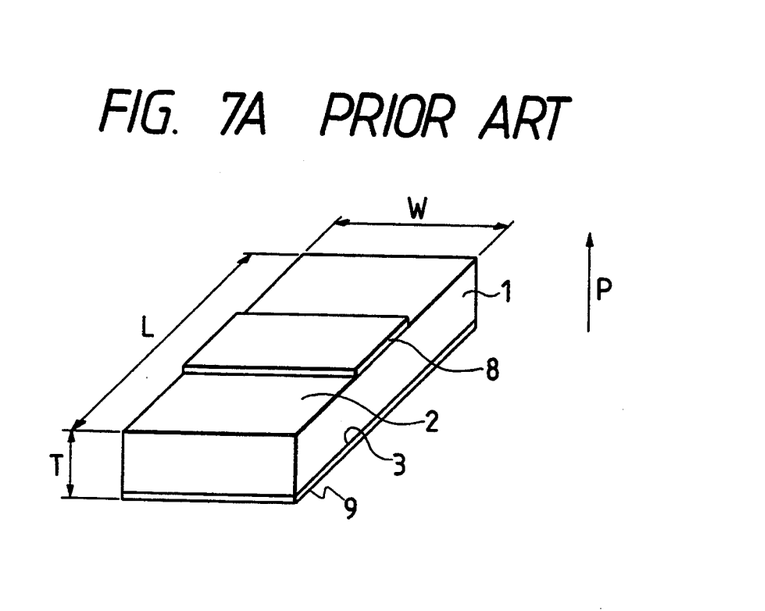
FIG. 7A is a perspective view of a prior art resonator used for a series resonator of a ladder filter.
Figure 7B:
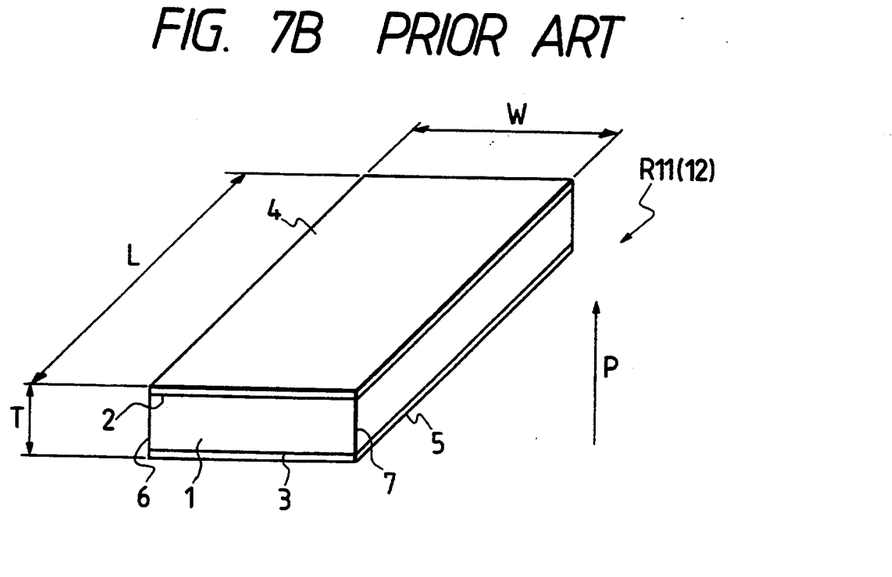
FIG. 7B is a perspective view of a prior art resonator used for a parallel resonator in a prior art ladder filter.

An example of a prior art resonator will be described with reference to FIG. 7A. FIG. 7A is a perspective view of the prior art resonator used for the series resonator of a ladder filter. This prior art piezoelectric resonator comprises a rectangular piezoelectric bar 1 having a length L, a width W smaller than the length L, and a thickness T; a partial electrode 8 formed on the surface 2 defined by $L \times W$; and a whole electrode 9 covering the opposite surface 3 defined by $L \times W$. Reference P denotes a direction of polarization. FIG. 7B is a perspective view of the prior art piezoelectric resonator R11 used for the parallel resonator in the prior art ladder filter. The difference between the resonator shown in FIG. 7B from the resonators shown in FIG. 7A is the whole electrode 4 is used instead of the partial electrode 8.

However, in such a prior art rectangular bar type of piezoelectric resonators as shown in FIG. 7A and 7B, there is a problem that spurious responses caused by vibrations in the width and thickness directions is considerable large. Moreover, there is a problem that an interval in frequency between the resonance frequency and antiresonance frequency of the piezoelectric resonator is small, which is caused by providing a partial electrode 8 for reducing the capacitance in the series resonator. Further, there is a problem that a characteristic of the resonator is changed by dispersion of a location of the partial electrode 8 developed in the mounting processing of the partial electrode 8 or by dispersion of an area of the partial electrode 8.

Moreover, when dimensions of the prior art resonator as shown in FIG. 7A or 7B are determined to have a ratio between the length L and width W such that $(W/L) > (\frac{1}{3})$, a coupling factor K31 of the length expander mode is considerably small.

In the filter including the prior art resonator disclosed in Japanese patent application provisional publication No. 50-67054, there is a problem that different materials having different coupling factors should be used between the series and parallel resonators. Moreover, in a filter using the series resonator having the partial electrode, there is a problem that a passband of the filter is made more narrow or there is a dispersion in a characteristic of the filter.

Figure 15A:
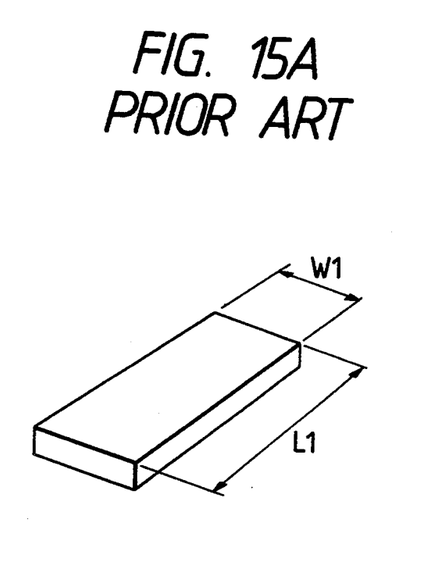
FIGS. 15A and 15B are perspective views of prior art parallel and series resonators of another prior art ladder filter.
Figure 15B:
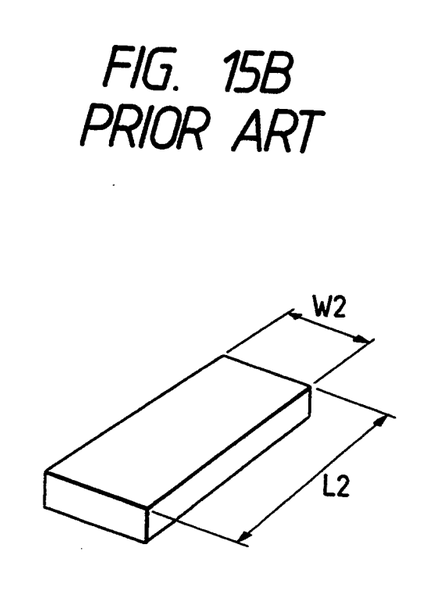

Another prior art ladder filter including series resonators and parallel resonators is disclosed in Japanese utility model application provisional publication No. 51-10878. FIGS. 15A and 15B are perspective views of prior art parallel and series resonators of this prior art ladder filter. The series resonator is formed to have a width $W_2$ and a length $L_2$. The parallel resonator is formed to have a width $W_1$ and a length $L_1$. The widths $W_1$ and $W_2$ are determined as to agree with each other to eliminate a spurious output caused by vibration in the width direction.

In these prior art resonators, there is a problem that peak spurious output caused by vibration in the width direction are steep and large.

SUMMARY OF THE INVENTION

The present invention has been developed in order to remove the above-described drawbacks inherent to the conventional piezoelectric resonator and a piezoelectric filter using this piezoelectric resonator.

According to the present invention there is provided a first piezoelectric resonator for resonating in the length expander mode, comprising: a piezoelectric bar formed in a substantial rectangular parallelopiped: and electrodes formed on a pair of confronting surfaces of the piezoelectric bar, the confronting surfaces extending in the longitudinal direction of the piezoelectric bar, the piezoelectric bar having at least a bevel portion extending the longitudinal direction. In other words, the first piezoelectric resonator for resonating in the length expander mode, comprises: a piezoelectric bar having first and second rectangular surfaces confronting each other in parallel and a third rectangular surface extending in the longitudinal direction of the first and second rectangular surfaces, the third rectangular surface being beveled against the first and second rectangular surfaces; and electrodes formed on the first and second surfaces.

According to the present invention there is also provided a first ladder filter comprising: at least a filter circuit, each filter circuit having series and parallel resonators for resonating in the length expander mode, the series and parallel resonators including piezoelectric bars formed in substantial rectangular parallelopipeds, the series resonator having a resonance frequency, a first spurious resonance frequency, and a first spurious antiresonance frequency, the parallel resonator having an antiresonance frequency, a second spurious resonance frequency, and a second spurious antiresonance frequency, the resonance frequency of the series resonator substantially agreeing with the antiresonance frequency of the parallel resonator, the series resonator having a bevel portion extending the longitudinal direction of the piezoelectric bar such that the first and second spurious resonance frequencies agree with each other and the first and second spurious antiresonance frequencies agree with each other to suppress the spurious output of the ladder filter.

According to the present invention there is further provided a second piezoelectric resonator for resonating in length expander mode, comprising: a piezoelectric bar formed in a rectangular parallelopiped having a length L, a width W, and a thickness T wherein $L>W>T$; and electrodes formed on a pair of confronting surfaces of the piezoelectric bar defined by the length L and thickness T.

According to the present invention there is also provided a second ladder filter comprising: at least a filter circuit, each filter circuit having series and parallel resonators for resonating in length expander mode, the series resonator having: a first piezoelectric bar formed in a first rectangular parallelopiped having first and second pairs of confronting surfaces with first and second distances respectively, extending in the longitudinal direction of the first piezoelectric bar; and first electrodes formed on the first pair of confronting surfaces, the parallel resonator having: a second piezoelectric bar formed in a second rectangular parallelopiped having third and fourth pairs of confronting surfaces with third and fourth distances respectively, extending in the longitudinal direction of the piezoelectric bar; and second electrodes formed on the fourth pair of confronting surfaces, a ratio of capacitances between the first and second electrodes being made relatively small by that the first distance is larger than the second distance and the fourth distance is smaller than the third distance.

According to the present invention there is further provided a third ladder filter comprising: at least a filter circuit, each filter circuit having series and parallel resonators for resonating in length expander mode, the series resonator having: a first piezoelectric bar formed in a first rectangular parallelopiped having a length L1, a width W1, a thickness T1 wherein $L1>W1>T1$; and first electrodes formed on a first pair of confronting surfaces defined by the length L1 and the thickness T1, the parallel resonator having: a second piezoelectric bar formed in a second rectangular parallelopiped having a length L2, a width W2, a thickness T2 wherein $L2>W2>T2$; and second electrodes formed on a second pair of confronting surfaces defined by the length L2 and the width W2.

According to the present invention there is also provided a third piezoelectric resonator for resonating in length expander mode, comprising: a piezoelectric bar formed in a rectangular parallelopiped having a length L, a width W, and a thickness T; and electrodes formed on a pair of confronting surfaces defined by the length L and the width W, wherein $W<T$ and $0.42<T/L<2.5$.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Hereinbelow will be described a first embodiment of this invention.

Figure 1:
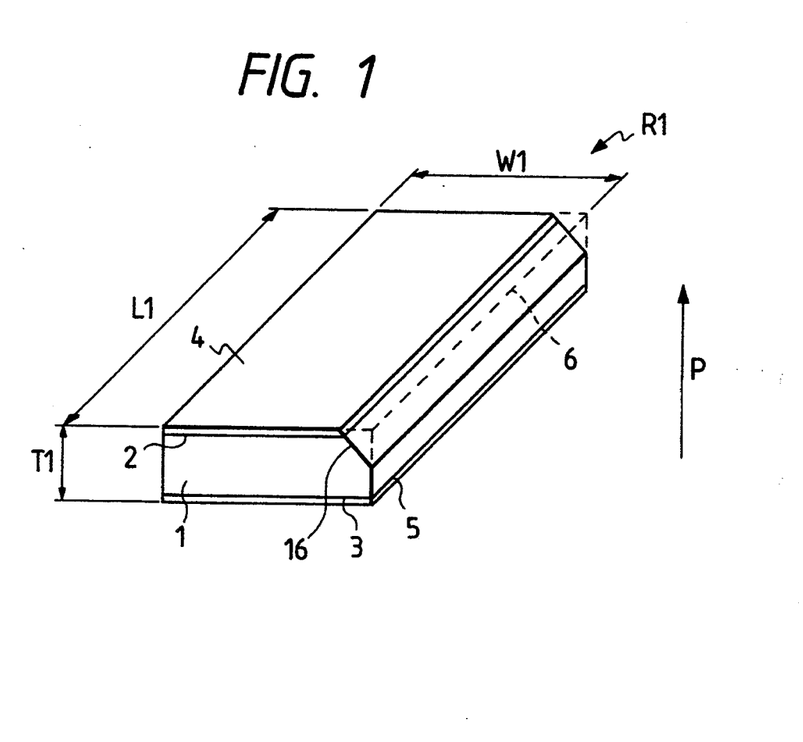
FIG. 1 is a perspective view of a first embodiment of a piezoelectric resonator of this invention.

FIG. 1 is a perspective view of the first embodiment of a piezoelectric resonator R1 of this invention. The piezoelectric resonator R1 of the first embodiment comprises a piezoelectric bar 1 substantially formed in a rectangular bar and whole electrodes 4 and 5, the piezoelectric bar 1 being sandwiched between the whole electrode 4 and 5, the piezoelectric bar 1 having a bevel portion 16.

The piezoelectric resonator R1 vibrates in the length expander mode and has a length L1, a width W1, and a thickness T1 wherein $L1>W1>T1$. A polarizing direction P extends in the thickness direction. A whole electrode 4 is formed on a first surface 2 of the piezoelectric bar 1 such that the whole electrode 4 covers the first surface 2 completely, represented by W1×L1 and the other whole electrode 3 is formed on a second surface 3 confronting the first surface in parallel such that the whole electrode 5 covers the second surface 3 completely. An edge 6 of the first surface extending in the longitudinal direction of the piezoelectric resonator R1 is bevelled. That is, a portion of the whole electrode 4 and a portion of the piezoelectric bar 1 is cut slantwise. Therefore, the piezoelectric bar 1 has a bevel portion 16. Resultantly, the whole electrode 4 has a bevel portion also.

The polarizing direction P is perpendicular to the electrodes 4 and 5, so that electrodes which have been used for formation of polarization can be used as the whole electrodes 4 and 5 of the piezoelectric resonator R1 as they are.

That is, a piezoelectric resonator R1 of the first embodiment for resonating in the length expander mode, comprises: a piezoelectric bar 1 formed in a substantial rectangular parallelopiped; and whole electrodes 4 and 5 formed on a pair of first and second confronting surfaces 2 and 3 of the piezoelectric bar 1, the first and second confronting surfaces 2 and 3 extending in the longitudinal direction of the piezoelectric bar 1 having at least a bevel portion extending in the longitudinal direction. In other words, the piezoelectric resonator R1 of the first embodiment for resonating in the length expander mode, comprises: a piezoelectric bar 1 having first and second rectangular surfaces 2 and 3 confronting each other in parallel and a third rectangular surface (bevel portion) 16 extending in the longitudinal direction of the first and second rectangular surfaces 2 and 3, the third rectangular surface 16 being beveled against the first and second rectangular surfaces; and the whole electrodes 4 and 5 formed on said first and second surfaces 2 and 3.

Hereinbelow will be described operation of the first embodiment of the piezoelectric resonator R1 with reference to FIGS. 1 and 2.

Figure 2:
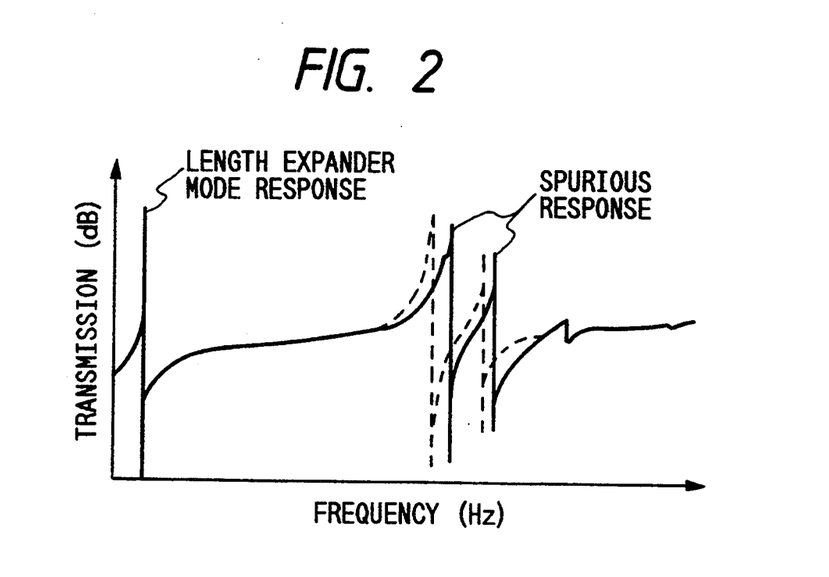
FIG. 2 shows a transmission characteristic of the first embodiment of the piezoelectric resonator with respect to frequency.

FIG. 2 shows a transmission characteristic of the first embodiment of the piezoelectric resonator R1 with respect to frequency. A solid line in FIG. 2 represents the transmission characteristic of the first embodiment of the piezoelectric resonator R1, namely, it is obtained after cutting the edge 6. A chain line in FIG. 2 represents a transmission characteristic obtained by a piezoelectric resonator before cutting of the edge 6. A peak of transmission at a low frequency in the drawing shows a resonance frequency of this piezoelectric resonator R1, that is, a resonance in the length expander mode in the longitudinal direction of the piezoelectric bar 1. Peaks of chain and solid lines at an intermediate frequency region (in the drawing) are caused by widths of these piezoelectric bars and peaks of chain and solid lines at an high frequency region (in the drawing) are caused by thicknesses of these piezoelectric bars. These peaks at the intermediate and high frequency region in the drawing represent spurious responses. The smaller the thickness or width of the piezoelectric bar the higher the frequencies of the spurious response. Here, as shown in FIG. 2, the resonance frequency of the piezoelectric resonator R1 and the piezoelectric resonator before slant cutting has the same resonance frequency because these resonators have approximately the same length L1. On the other hand, the spurious responses of the piezoelectric resonator R1 caused by the width W1 and thickness T1 are shifted in the higher frequency direction with respect to the spurious responses of the resonator before the slant cutting. That is, bevelling the edge 6 changes both effective values of the width and thickness of the piezoelectric resonators R1, so that frequencies of spurious responses caused by both width and the thickness are shifted to higher frequencies.

Figure 3:
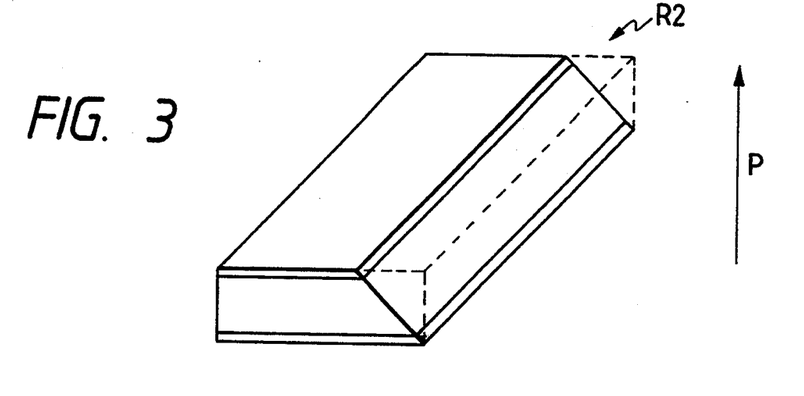
FIG. 3 is a perspective view of a first modified embodiment of the first embodiment of a piezoelectric resonator of this invention.
Figure 4:
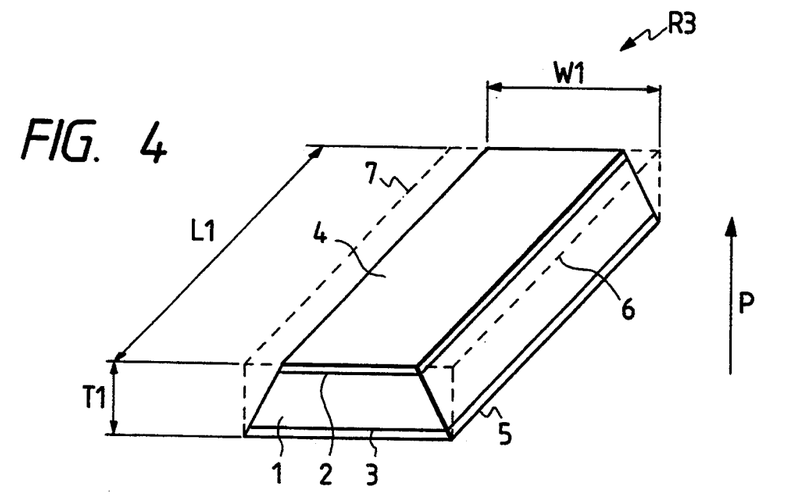
FIG. 4 is a perspective view of a second modified embodiment of the first embodiment of a piezoelectric resonator of this invention.

FIG. 3 is a perspective view of a first modified embodiment of the first embodiment of a piezoelectric resonator R2 of this invention. The piezoelectric resonator R1 of the first embodiment has a cross section of a pentagon as shown in FIG. 1. However, the shape of the cross section changes from a pentagon to trapezoid in accordance with an amount of cutting. That is, if the piezoelectric bar is beveled slightly, the cross section shows a pentagon. However, if the slant cutting reaches the second surface 3, the cross section has a trapezoid shape. FIG. 3 shows such an example. FIG. 4 is a perspective view of a second modified embodiment of the first embodiment of a piezoelectric resonator R3 of this invention. The piezoelectric resonator R3 has two bevel portions as shown. The frequency of the spurious response increased with increase in the amount of cutting or increase in the number of cut edges.

As mentioned above, according to the first embodiment, in the piezoelectric resonator having a piezoelectric bar having a rectangular bar 1 for providing a length expander mode resonators, whole electrodes 4 and 5 formed on the first surface 2 defined by W1×L1 and on the second surface 3 opposite to the first surface 2, at least one edge of the first surface 2 is cut slantwise to shift frequencies of spurious response caused by width and thickness of the piezoelectric bar 1 without change in the resonance frequency defined by the length L1 of the piezoelectric bar 1.

In this embodiment, electrodes 4 and 5 covers the first and second surfaces of the piezoelectric bar 1 completely. However, a partial electrode can be used also to reduce a capacitance caused by the electrodes sandwiching the piezoelectric bar. Moreover, as shown in FIG. 2, the peak level of the spurious response (solid line) caused by the width is reduced compared with the spurious response of the width of the piezoelectric resonator before the slant cutting. This is because a band width of the spurious response caused by width of the piezoelectric resonator is broaden, so that the peak level decreases with the broadening of the band width of the spurious response.

Figure 5:
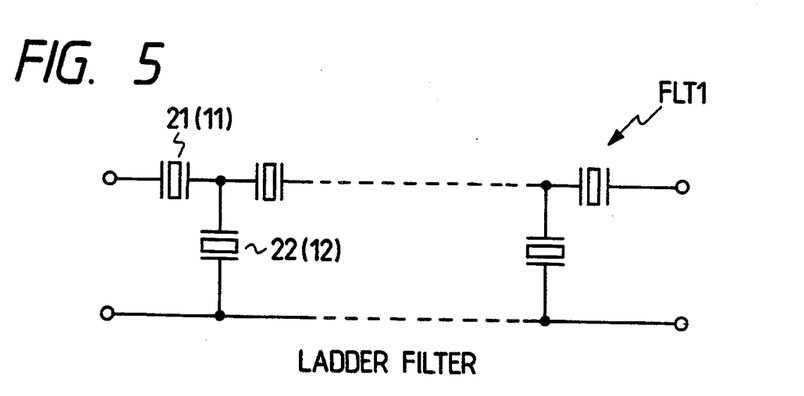
FIG. 5 is a schematic diagram of a ladder filter of this invention and is used in the second and third embodiments.
Figure 6A:
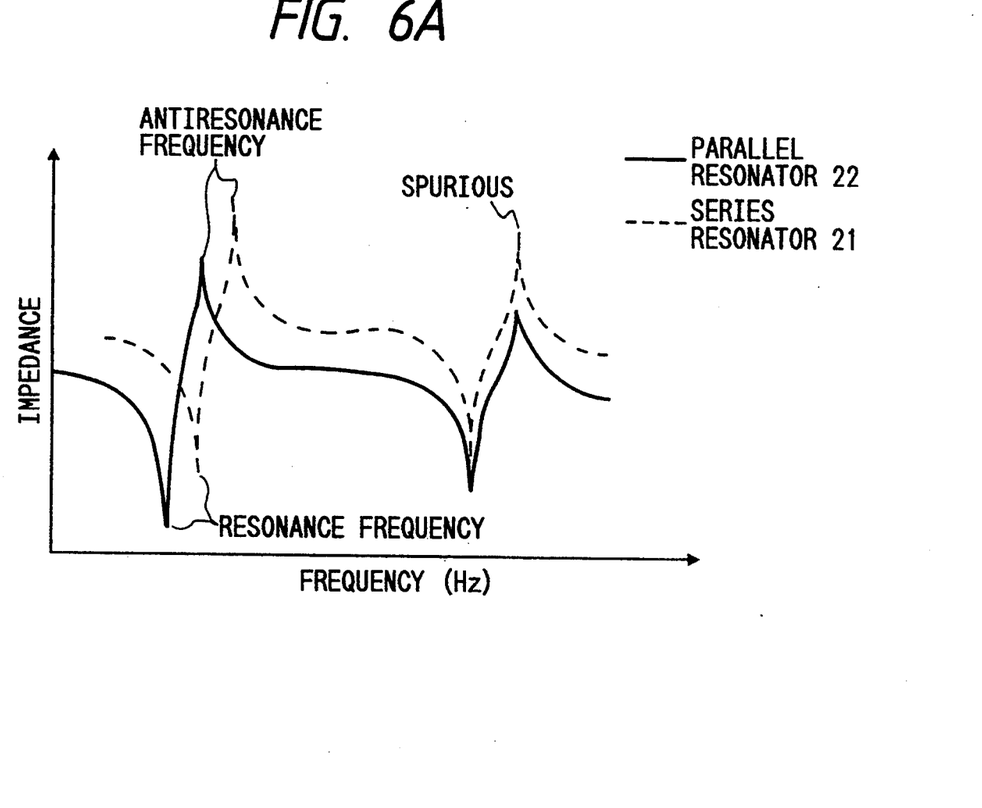
FIG. 6A shows impedance characteristics of the parallel resonator and the series resonator of the second embodiment.
Figure 6B:
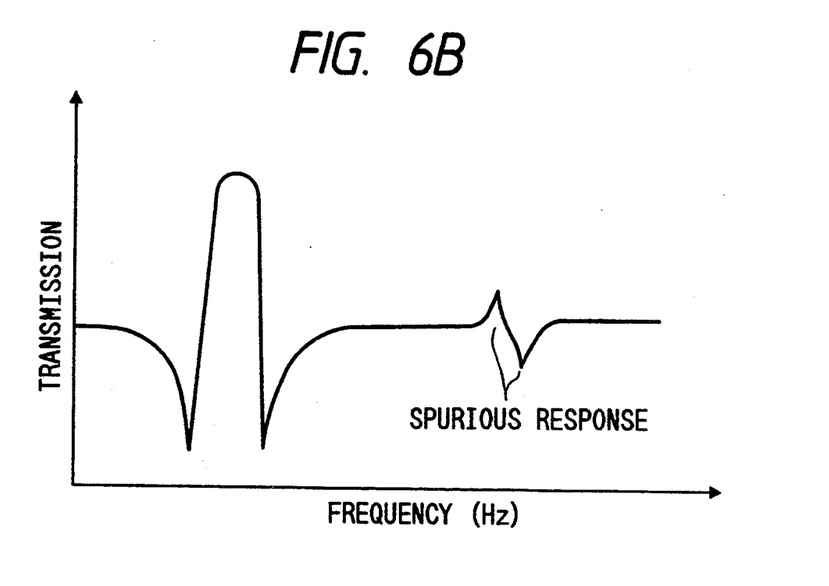
FIG. 6B shows a transmission characteristic of the ladder filter using the series resonator and the parallel resonator having the impedance characteristics as shown in FIG. 6A.

Hereinbelow will be described a second embodiment of this invention. FIG. 5 is a schematic diagram of a ladder filter FLT1 of this invention. The ladder filter FLT1 has one to several stages of filter circuits. Each stage including a series resonator 21 and a parallel resonator 22 connected to the output of the series resonator 21. In the second embodiment, the resonator R1 of the first embodiment is used as the series resonator 21 in the ladder filter FLT1 of the second embodiment to obtain a favourable spurious response characteristic. That is, a frequency of the spurious response of the series resonator 21 is determined to agree with that of the parallel resonator 22 to reduce a spurious output of the ladder filter FLT1. FIG. 6A shows impedance characteristics of the parallel resonator 21 and the series resonator 22 of the second embodiment. A solid line in FIG. 6A represents the impedance characteristic of the parallel resonator 21. A chain line in FIG. 6A represents an impedance characteristic of the series resonator 22. As shown in FIG. 6A, a resonance frequency of the series resonator 22 agrees an antiresonance frequency of the parallel resonator 21 to obtain a desired passband. On the other hand, a spurious resonance frequency of the series resonator 21 showing low impedance agrees with that of the parallel resonator 22 and a spurious antiresonance frequency showing a high impedance of the series resonator 21 agrees with that of the parallel resonator 22. Therefore, each stage of the filter circuits provides a passband showing a low insertion loss around the resonance frequency of the series resonator 21 and other elimination bands on the both side of the passband including the spurious response frequencies. FIG. 6B shows a total transmission characteristic of this ladder filter FLT1 using the series resonator 21 and the parallel resonator 22 having the impedance characteristics as shown in FIG. 6A. As shown in FIG. 6B, the spurious resonances are suppressed considerably. That is, the spurious resonance frequency of the series resonator 21 caused by the width thereof is shifted to that of the parallel resonator 22 to cancel the spurious responses of the series and parallel resonators 21 and 22.

More specifically, in the conventional ladder filter, the passband having a steep frequency characteristic and a low insertion loss are obtained by agreement of the resonance frequency of the series resonator with the antiresonance frequency of the parallel resonator. However, when the resonance frequency of the spurious response of parallel resonator 22 agrees with the antiresonance frequency of the spurious response of the series resonator 21, a considerable large spurious response is developed. In this embodiment, with a relation between the resonance frequency of the series resonator 21 and the antiresonance frequency of the parallel frequency fixed, the series resonator 21 and parallel resonator 22 are formed to have the resonance frequency of the spurious responses of the series resonator 21 agreeing with that of the parallel resonator 21 to cancel the spurious responses of these resonators. That is, the resonance and antiresonance frequencies of the series resonator 21 shifted in the higher frequency direction to agree with the resonance and antiresonance frequencies of the parallel resonator 22.

Figure 8:
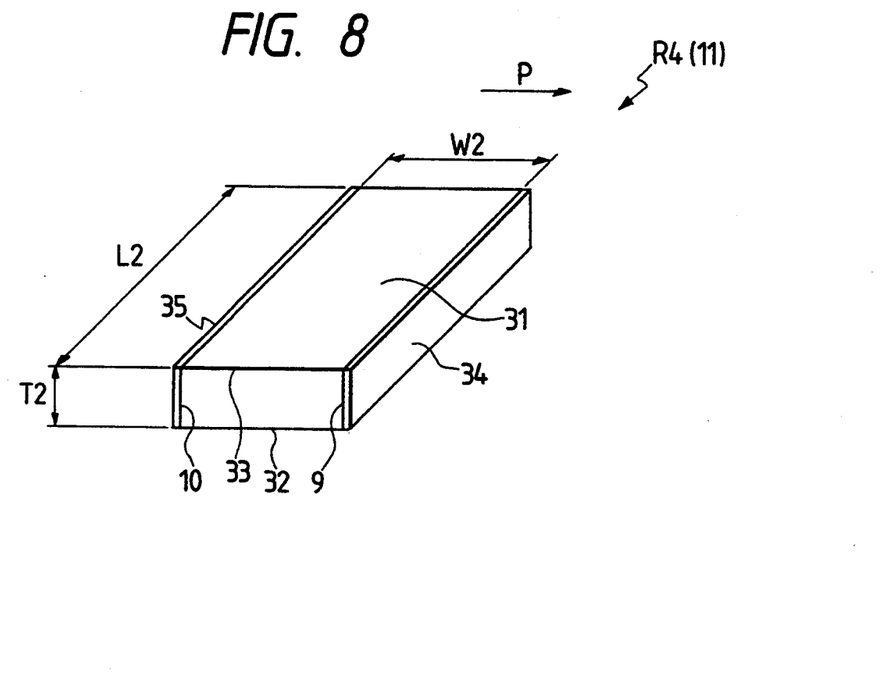
FIG. 8 is a perspective view of a third embodiment of piezoelectric resonator.

Hereinbelow will be described a third embodiment of piezoelectric resonator of this invention. FIG. 8 is a perspective view of the third embodiment of piezoelectric resonator. The piezoelectric resonator R4 of the third embodiment comprises a piezoelectric bar 31 substantially formed in a rectangular bar, whole electrodes 34 and 35 formed on both side surfaces of the piezoelectric bar 31 extending in the thickness and longitudinal directions of the piezoelectric bar 31.

The piezoelectric resonator R4 vibrates in the length expander mode and has a longitudinal length L2, width W2, and a thickness T2 wherein $L2 > W2 > T2$. A polarizing direction P agrees with the width direction. A whole electrode 34 is formed on a first side surface 9 of the piezoelectric bar 1, and the other whole electrode 35 is formed on a second side surface 10 confronting the first side surface 9 in parallel. That is, whole electrodes 34 and 35 are formed on the first and second side surfaces 9 and 10 out of surfaces extending in the longitudinal direction of the piezoelectric bar 31. That is, they are formed on the side surfaces 9 and 10 having a smaller area than top and bottom surfaces 32 and 33. In other words, the piezoelectric resonator R4 of the third embodiment for resonating in length expander mode comprises: a piezoelectric bar 31 formed in a rectangular parallelopiped having a length L2, a width W2, and a thickness T2 wherein $L2 > W2 > T2$; and whole electrodes 34 and 35 formed on a pair of confronting surfaces of the piezoelectric bar 1 defined by the length L2 and thickness T2.

The polarizing direction P is perpendicular to the electrodes 34 and 35, so that electrodes which have been used for formation of polarization can be used as the whole electrodes 34 and 35 of the piezoelectric resonator R4 as they are.

In this embodiment, electrodes 34 and 35 covers the first and second side surfaces of the piezoelectric bar 31 completely. However, a partial electrode can be used also to further reduce a capacitance caused by the electrodes 34 and 35 sandwiching the piezoelectric bar 31.

Hereinbelow will be described operation of the third embodiment of the piezoelectric resonator R4 with reference to FIG. 9.

Figure 9:
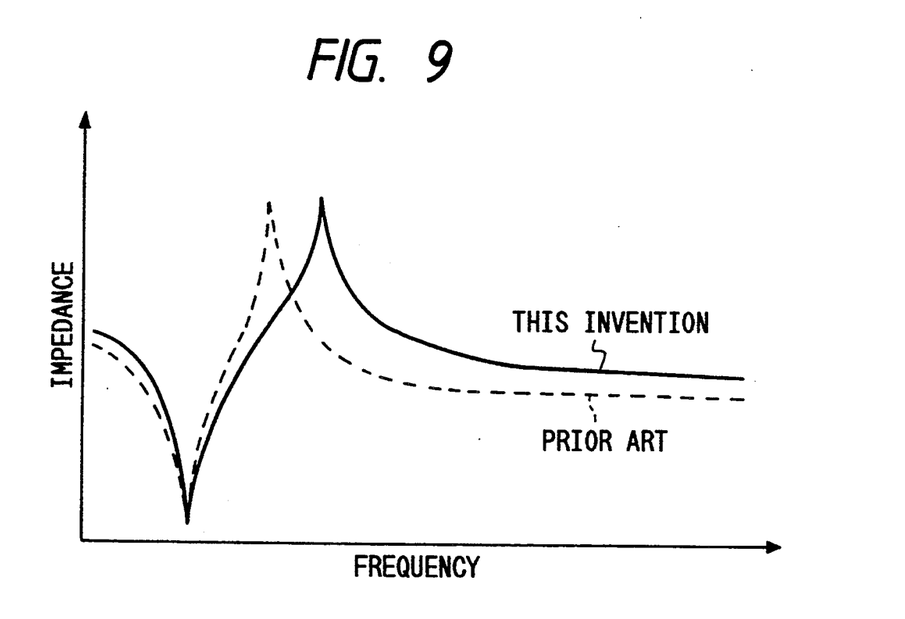
FIG. 9 shows an impedance characteristic of the third embodiment of the piezoelectric resonator with respect to frequency.

FIG. 9 shows an impedance characteristic of the third embodiment of the piezoelectric resonator R4 with respect to frequency. A solid line in FIG. 9 represents the impedance characteristic of the third embodiment of the piezoelectric resonator R4 shown in FIG. 8. A chain line in FIG. 9 represents an impedance characteristic of the prior art piezoelectric resonator R11 as shown in FIG. 7B for comparison.

A frequency interval between a resonance frequency and an antiresonance frequency of the piezoelectric bar 31, namely, an interval between a peak and a valley of the solid line shown in FIG. 9, depends on mounting positions or areas of whole electrodes 34 and 35 and a capacitance of the piezoelectric resonator R4 depends on the areas of the whole electrodes 34 and 35 and a distance therebetween, that is, the width W2.

In a ladder filter, whose circuit configuration is represented by FIG. 5, including the piezoelectric resonator R4 for series resonators, decrease in the capacitance of the piezoelectric resonator R4 provides a higher capacitance ratio between the series resonator 21 and parallel resonator 22 included in the ladder filter, so that a higher attenuation is provided at an elimination band. Therefore, the capacitance of the piezoelectric resonator R4 can be reduced without decrease in the electromechanical coupling factor of the length expander mode. That is, if this piezoelectric resonator R4 is used for the series resonator 21, the higher capacitance ratio between the series resonator 21 and parallel resonator 22 provides a high attenuation at the elimination band without increase in the insertion loss of this resonator because the electromechanical coupling factor is unchanged. That is, the ladder filter FLT2 of this embodiment comprises: at least a filter circuit, each filter circuit having series and parallel resonators 11 and 12 for resonating in length expander mode, said series resonator 11 having: the first piezoelectric bar 31 formed in a first rectangular parallelopiped having first pairs of confronting surfaces 9 and 10 and second pairs of confronting surfaces 32 and 33 with first distance W2 and second distance T2 respectively, extending in the longitudinal direction of the first piezoelectric bar 31; and first electrodes formed on said first pair of confronting surfaces 9 and 10, said parallel resonator 12 having: a second piezoelectric bar 1 formed in a second rectangular parallelopiped having third pairs of confronting surfaces 6 and 7 and fourth pairs of confronting surfaces 2 and 3 with third distance W and fourth distance T respectively, extending in the longitudinal direction of said piezoelectric bar 1; and second electrodes 4 and 5 formed on said fourth pair of confronting surfaces 2 and 3, a ratio of capacitances between said first and second electrodes being made relatively small by that said first distance W2 is larger than said second distance T2 and said fourth distance T is smaller than said third distance W.

Figure 10A:
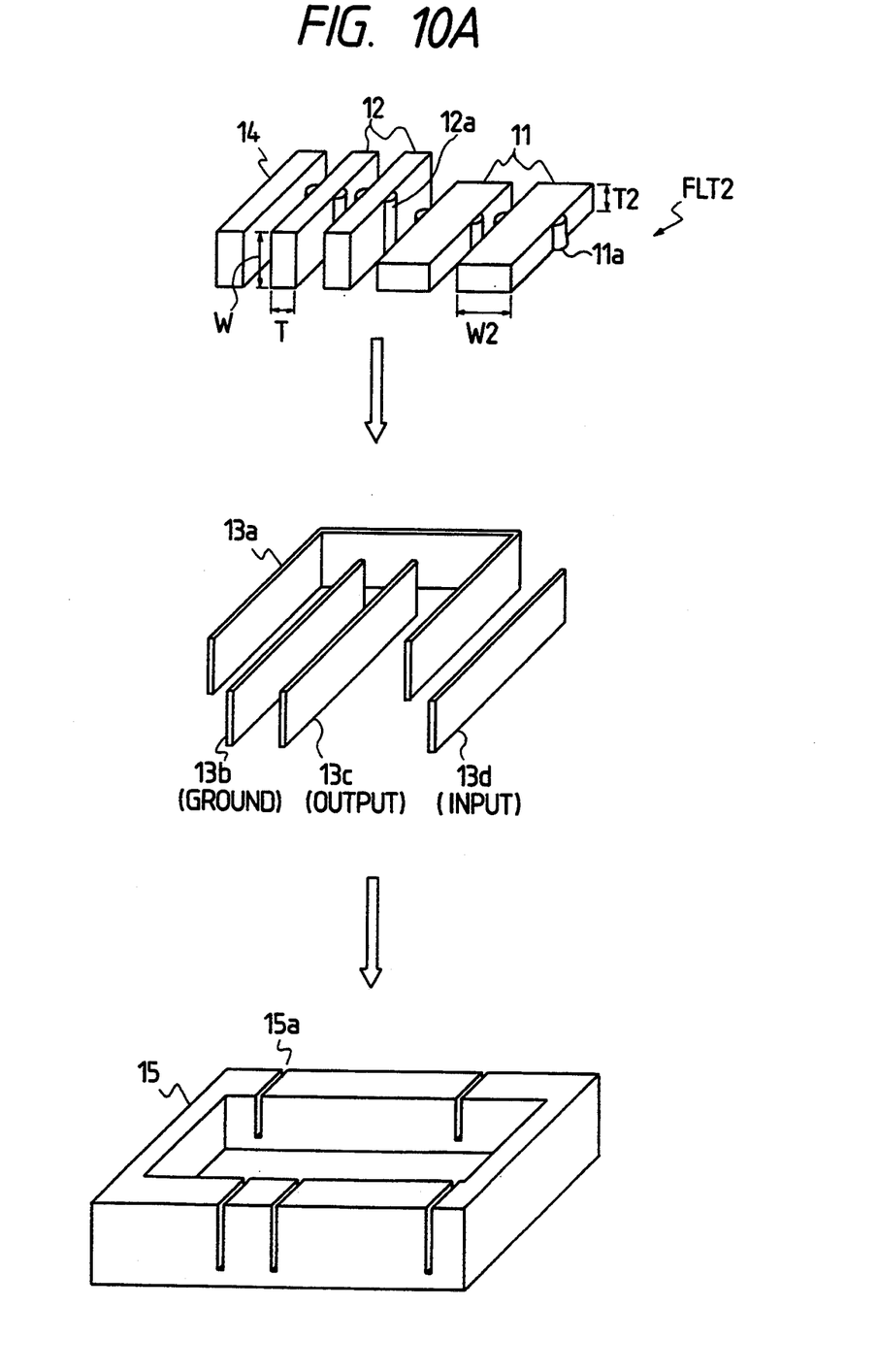
FIG. 10A is a perspective view of the third embodiment of the ladder filter including the piezoelectric resonator shown in FIG. 8 for showing a condition before the assembling of parts of the ladder filter.

FIG. 10A is a perspective view of the third embodiment of the ladder filter FLT2 including this piezoelectric resonator R4 for showing a condition before the assembling of parts of the ladder filter having a circuit configuration as shown in FIG. 5.

Series resonators 11, parallel resonators 12, and an elastic material 14, such as silicone rubber, are arranged as shown and put into an inside of a frame 15 with metal plates 13a to 13d sandwiched therebetween.

The piezoelectric resonator R4 is used for the series resonators 11. On the other hand, a prior art piezoelectric resonator R11 as shown in FIG. 7B is used for the parallel resonators 12. That is, whole electrodes 4 and 5 are formed on top and bottom surfaces (in the drawing).

These series resonators 11 and parallel resonators 12 are connected with the metal plates 13a to 13d through supporting blocks 11a and 12a which provides electrical connection also. Therefore, the circuit connection of the ladder filter FLT1 is provided by the metal plates 13a to 13d and the supporting blocks 11a and 12b. These supporting blocks 11a and 12b may be provided to the metal plates 13a to 13d. The metal plate 13b is used as a ground terminal also. The metal plate 13c is used as an output terminal also. The metal plate 13d is used as an input terminal also. These metal plates 13a to 13d are fixed to the frame 15 by fitting these metal plates 13a to 13d into slots 15a provided in the frame 15.

Length L2 of the series resonator has substantially the same length L of the parallel resonator 12. The side surface of the series resonator 11, defined by T2 and W2 has substantially the same shape as the side surface of the parallel resonator 12, defined by T and W. That is, a cross section in the perpendicular direction of the longitudinal direction of the series resonator 11 is substantially the same as that of the parallel resonator 12.

Figure 10B:
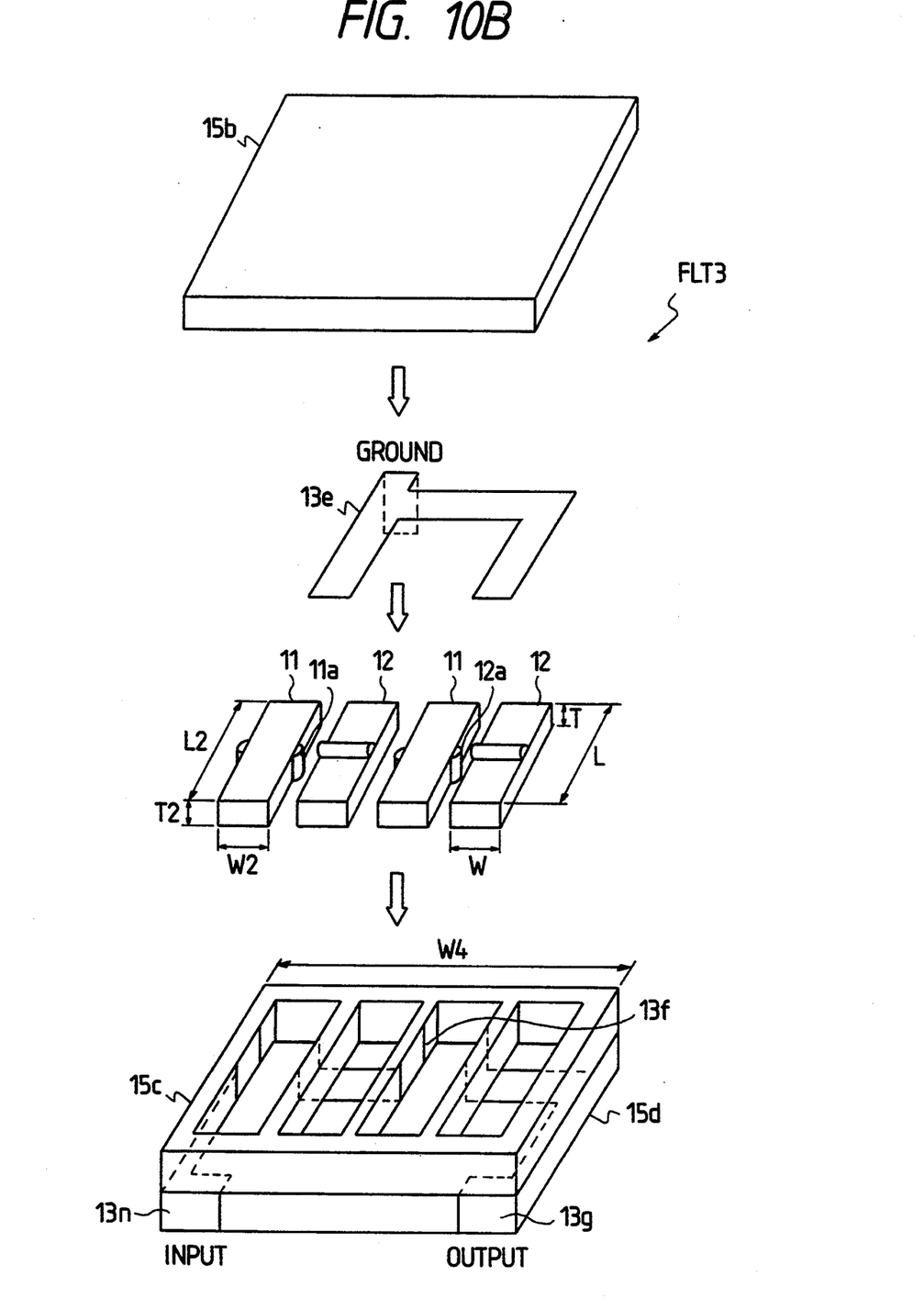
FIG. 10B is a perspective view of a modified embodiment of the third embodiment of the ladder filter including this piezoelectric resonator for showing a condition before the assembling of parts of the ladder filter.

FIG. 10B is a perspective view of a modified embodiment of the third embodiment of the ladder filter including this piezoelectric resonator R4 for showing a condition before the assembling of parts of the ladder filter.

Series resonators 11 and parallel resonators 12 are arranged as shown and put into an inside of a frame 15c with metal plates 13e to 13h arranged to provide interconnection between resonators and leads for input, output and ground terminals.

The piezoelectric resonator R4 is used for the series resonators 11. On the other hand, a piezoelectric resonator as shown in FIG. 7B is used for the parallel resonators 12. That is, whole electrodes 4 and 5 are formed on top and bottom surfaces 2 and 3. These series resonators 11 and parallel resonators 12 are connected with the metal plates 13e to 13h through supporting blocks 11a and 12a which provide electrical connection also. Therefore, the circuit connection of the ladder filter FLT3 is provided by the metal plates 13e to 13h and the supporting blocks 11a and 12b.

Length L2 of the series resonator 11 has substantially the same length L of the parallel resonator 12. The side surface of the series resonator 11, defined by T2 and W2 has substantially the same shape as the side surface of the parallel resonator 12, defined by T and W. That is, a cross section in the perpendicular direction of the longitudinal direction of the series resonator 11 is substantially the same as that of the parallel resonator 12. Moreover, the series and parallel resonators 11 and 12 are arranged on the same bottom plate 15d with the same height corresponding to the thicknesses T and T2. Therefore, this structure reduces sizes of the ladder filter FLT 3. Particularly, the height of the top plate 15b to the bottom plate 15 is reduced. Moreover, when each of series and parallel resonators 11 and 12 are mounted to the frame 15c such that a surface defined by the length L or L3 and thickness T or T2 contacts with the bottom plate 15d, a width W4 of the frame 15c is, reduced.

Figure 11:
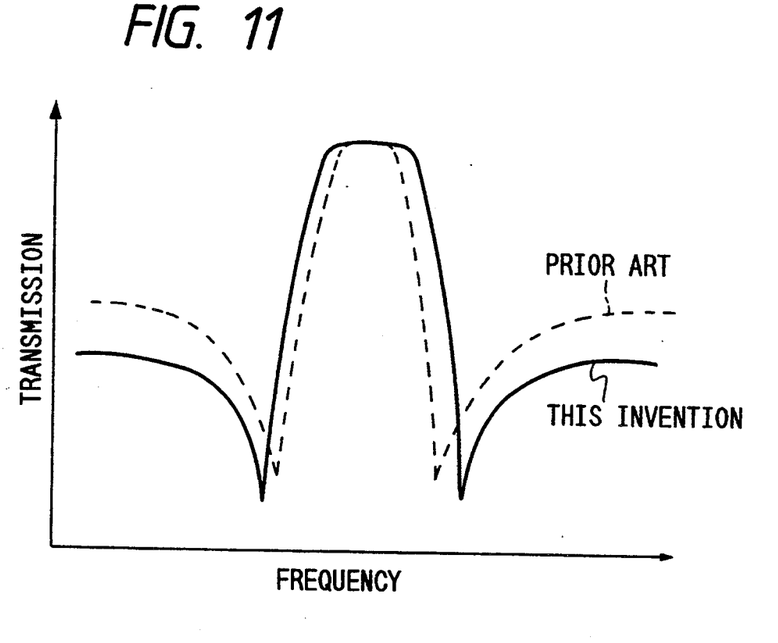
FIG. 11 shows a transmission characteristic of the third embodiment of the ladder filter.

FIG. 11 shows a transmission characteristic of the third embodiment of the ladder filter FLT 2. In FIG. 11, a solid line shows the transmission characteristic of the third embodiment of the ladder filter FLT2. A chain line shows a transmission characteristic of a prior art ladder filter including series piezoelectric resonators as shown in FIG. 7A having a partial electrode 8 and parallel piezoelectric resonators as shown in FIG. 7B. As shown in FIG. 11, the transmission characteristic of the ladder filter FLT2 shows a wider passband and higher attenuation at the elimination bands than that of the prior art ladder filter using the piezoelectric resonators shown in FIG. 7A and 7B.

As mentioned above, in the series resonator 11 having dimensions of the length L2, width W2, and thickness T2 of the ladder filter FLT2 or FLT3, wherein L2>W2>T2, whole electrodes 34 and 35 are formed on a pair of confronting side surfaces defined by dimensions L2 and T2 respectively. Therefore, the capacitance of the series resonator 11 can be made small without change in the frequency interval between the resonance and antiresonance frequencies of the series resonator 11. On the other hand, in the parallel resonator 12 having dimensions of the length L, width W, and thickness T of the ladder filter FLT1, wherein L>W>T, whole electrodes 4 and 5 are formed on a pair of confronting side surfaces defined by dimensions L and W respectively. Therefore, the attenuation at the elimination bands is increased due to the small capacitance of the series resonator 11 and a bandpass of the ladder filter is broadened due to unchanging in the frequency interval between the resonance and antiresonance frequencies of the series resonator 11.

In the third embodiment, the side surface of the series resonator 11, defined by L2 and W2 has substantially the same shape as the side surface of the parallel resonator 12, defined by L and W. However, it is possible that the series resonator 11 has another shape of the side surface different from the parallel resonator 12 as far as the capacitance ratio between the series and parallel resonators is increased.

Hereinbelow will be described a fourth embodiment of this invention with reference to FIG. 12.

Figure 12:
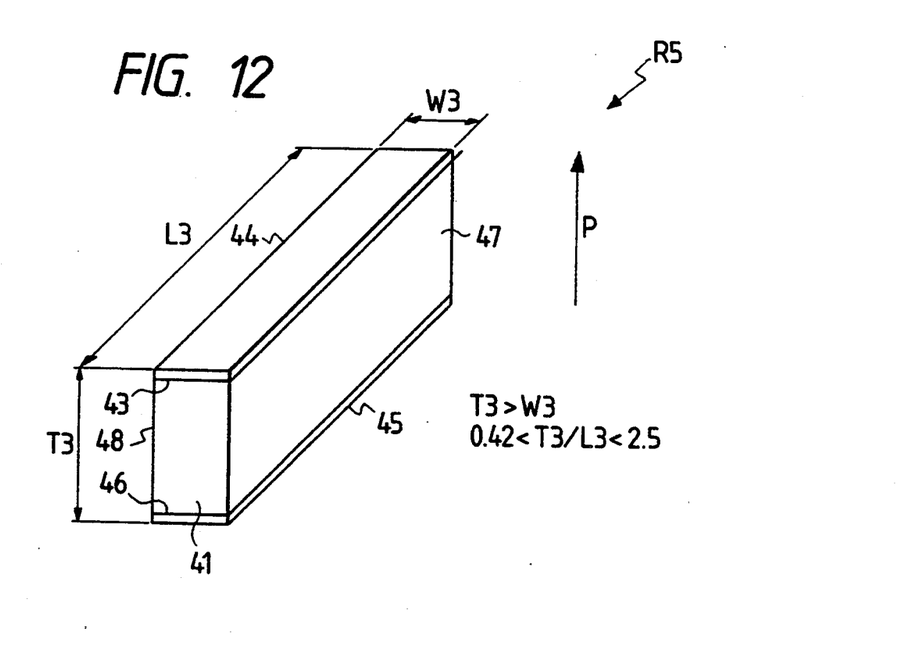
FIG. 12 is a perspective view of a fourth embodiment of a piezoelectric resonator.

FIG. 12 is a perspective view of the fourth embodiment of a piezoelectric resonator R5. The piezoelectric resonator R5 of the fourth embodiment comprises a piezoelectric bar 41 substantially formed in a rectangular bar, whole electrodes 44 and 45 formed on both top and bottom surfaces 43 and 46 of the piezoelectric bar 41 extending in the width and longitudinal directions.

The piezoelectric resonator R5 vibrates in the length expander mode and has a longitudinal length width W3, and a thickness T3 wherein T3>W3 and $0.42(T3/L3)<2.5$. A polarizing direction P agrees with the thickness direction, namely, the polarizing direction is perpendicular to whole electrode 44 and 45. A whole electrode 44 is Formed on the top surface 43 of the piezoelectric bar 41, and the other whole electrode 45 is formed on the bottom surface 46 confronting the top surface in parallel. The top and bottom surfaces 43 and 46 have smaller areas than side surfaces 47 and 48. In other words, the whole electrodes 44 and 45 are formed on a first pair of surfaces out of first and second pair of surfaces 43, 47, and 48 extending in the longitudinal direction of the rectangular piezoelectric bar 41 wherein the first pair of surfaces 43 and 46 have a smaller area than the second pair surfaces 47 and 48.

This structure is basically the same as that of the third embodiment. However, the inventors found a condition showing a high electromechanical coupling factor in the rectangular formed piezoelectric resonator.

That is, in the condition, T3>W3 and 0.42<(T3/L-3)<2.5, a high electromechanical coupling factor of the piezoelectric resonator is provided.

Figure 13:
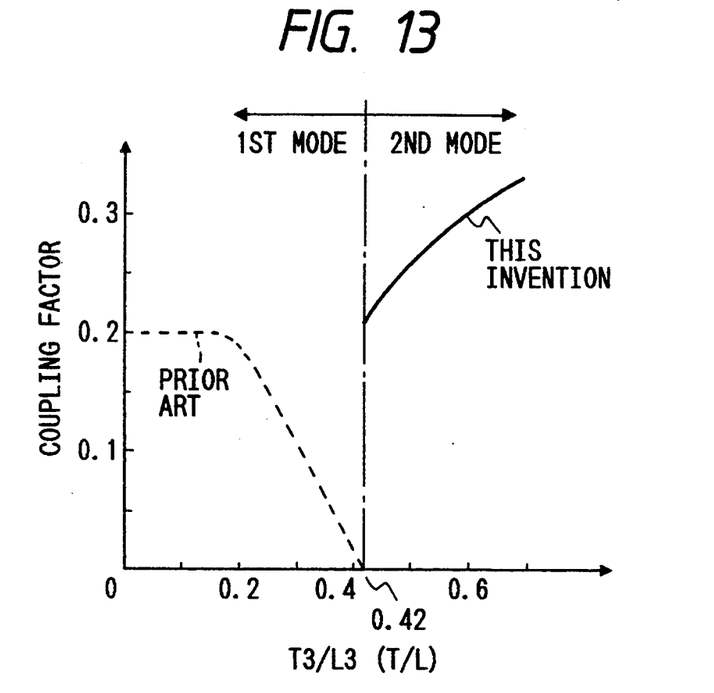
FIG. 13 shows a characteristic of a coupling factor of the piezoelectric resonator of the fourth embodiment.

FIG. 13 shows a characteristic curve of the coupling factor $K_{31}$ of the piezoelectric resonator R5 of the fourth embodiment by a solid line. A chain line in this drawing shows a characteristic of coupling factor $K_{31}$ of the piezoelectric resonator R11 of the prior art shown in FIG. 7B having the length L, the width W, and the thickness T, wherein L>W>T and the width W is equal to the length W3.

In FIG. 13, the characteristic curve of the coupling factor $K_{31}$ of the prior art piezoelectric resonator R11 shows a constant value of 0.2 from about 0.05 to 0.17 of the ratio of T/L and then, rapidly decreases from 0.17 to about 0.42 of T/L. This is a first mode, namely the length expander mode. On the other hand, in the coupling factor of the resonator having the dimensional condition, T3>W3 and 0.42<(T3/L3)<2.5, the characteristic curve of the coupling factor increases from about 0.21 to 0.33 in the range of the ratio of T3/L3 from 0.42 to 2.5. This is a second mode. The change from the first mode to the second mode comes suddenly. That is, the mode of vibration of the piezoelectric resonator changes from the length expander mode at about 0.42 of the ratio of T/L to the second mode. This second mode is considered as a vibration mode concerning Poisson coupling. Therefore, a higher coupling factor is provided by the dimensional condition, T3>W3 and 0.42<(T3/L3)<2.5 and thus, a broader passband is provided. In consideration of easiness of manufacturing the piezoelectric resonator, the ratio of T3/L3 is from 0.55 to 0.7 is favourable. In this regard, the ratio of T3/L3 is from 0.60 to 0.65 is more favourable. The ratio of T3/L3 more than 2.5 has not been experimented.

Hereinbelow will be described a measurement of the characteristic curves of the coupling factor of the piezoelectric resonator R4 (11) of the fourth embodiment and the piezoelectric resonator R11 (12) of the prior art shown in FIG. 7B.

The measurement was carried out under an initial condition of the piezoelectric resonator R4 of the fourth embodiment that:

L3=3.9 mm
W3=0.8 mm
T3=1.64 mm, and then, the width W3 and the thickness T3 were fixed and the length L3 was varied, that is, shortened to obtain the $K_{31}$ variable ratio of T3/L3. Thus, the coupling factors of the piezoelectric resonator R4 were measured. On the other hands, an initial condition of the piezoelectric resonator R11 of the prior art shown in FIG. 7B is that:

L=3.9 mm
W=0.8 mm
T=0.45 mm, and then, the width W and the thickness T are fixed and the length L is varied, that is, shortened to obtain the variable ratio of T/L. Thus, the coupling factors $K_{31}$ of the piezoelectric resonator R11 were measured.

Figure 14:
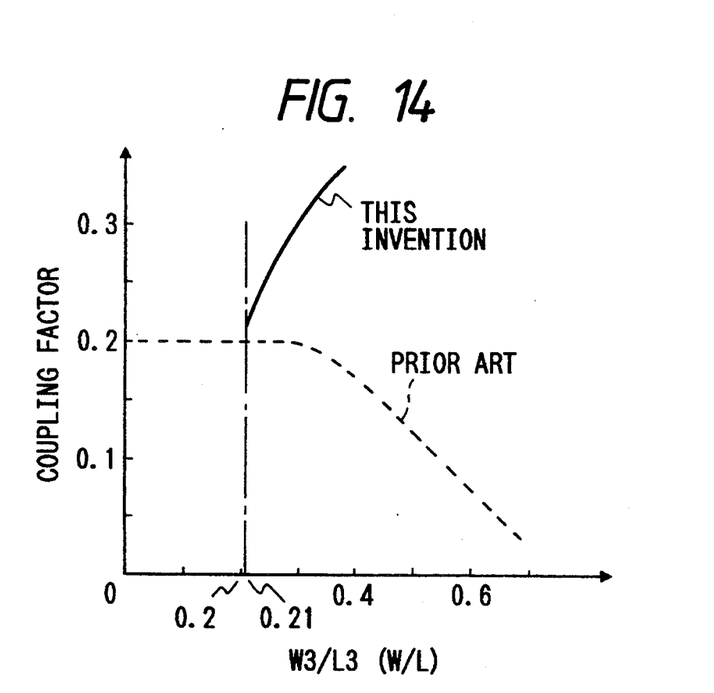
FIG. 14 shows a characteristic curve of coupling factor of the piezoelectric resonator of the fourth embodiment.

FIG. 14 shows a characteristic curve of coupling factor $K_{31}$ of the piezoelectric resonator R5 of the fourth embodiment by a solid line with a ratio of W3/L3 varied. A chain line in this drawing shows a characteristic of coupling factor $K_{31}$ of the piezoelectric resonator R11 of the prior art shown in FIG. 7B having the length L, the width W, and the thickness T, wherein L>W>T and the width W is equal to the width The characteristic curves of the coupling factors of the piezoelectric resonator R4 (11) of the forth embodiment and the piezoelectric resonator R11 (12) of the prior art shown in FIG. 7B were obtained with respect to a ratio between width and the length of the piezoelectric resonators.

An initial condition of the piezoelectric resonator R4 of the fourth embodiment that:

L3=3.9 mm
W3=0.8 mm
T3=1.64 mm, and then, the width W3 and the thickness T3 were fixed and the length L3 was varied, that is, shortened to obtain the $K_{31}$ variable ratio of W3/L3. Thus, the coupling factors of the piezoelectric resonator R4 were obtained, wherein the coupling factor increases from W/L=0.21. This characteristic is obtained as follows:

In FIG. 13, it is assumed that T3/L3=x. Then, W/L=Wx/T. Therefore, W3/L3=(0.8/1.64)x÷0.49x. Therefore, the characteristic curve of the coupling factor of the piezoelectric resonator R4 with respect to W3/L3 is obtained from the characteristic curve of the coupling factor of the piezoelectric resonator R4 shown in FIG. 13. Similarly, the characteristic curve of the coupling factor of the prior art piezoelectric resonator R11 with respect to W/L is obtained from the characteristic curve of the coupling factor of the piezoelectric resonator R11 shown in FIG. 13. That is, W/L÷1.78x. That is, a coupling factor $K_{31}$ at a point x is equal to that at a point W/L. The inclination of the characteristic curves depends on the value of W3/T3 or W/T.

As shown in FIG. 14, in a rage (W3/L3)>0.21, a higher coupling ratio is provided also.

As mentioned above, the piezoelectric resonator R5 is formed to have the ratio between the length L3 and T3 or L3 and W3, so that a high coupling factor is provided. Therefore, a boarder passband is provided with the same piezoelectric material. Moreover, it is possible to provide a plurality of piezoelectric resonators having different passbands using the same piezoelectric material.

The polarizing direction P of the piezoelectric resonator R5 is perpendicular to the electrodes 44 and 45, so that electrodes which have been used for formation of polarization can be used as the whole electrodes 44 and 45 of the piezoelectric resonator R5 as they are. Moreover, in this embodiment, electrodes 44 and 45 covers the first and second surfaces of the piezoelectric bar 41 completely. However, a partial electrode can be used also to further reduce a capacitance caused by the electrodes 44 and 45 sandwiching the piezoelectric bar 41.

What is claimed is:

1. A piezoelectric resonator for resonating in the length expander mode, comprising:

(a) a piezoelectric bar formed in a substantial rectangular parallelopiped having a length L, a width W, and a thickness T wherein L>W>T; and (b) electrodes formed on a pair of confronting surfaces of said piezoelectric bar, said confronting surfaces extending along the length L of said piezoelectric bar, and said piezoelectric bar having at least a bevel portion extending along the length L.

2. A piezoelectric resonator as claimed in claim 1, wherein a cross section of said piezoelectric bar perpendicular to said longitudinal direction is a pentagon.

3. A piezoelectric resonator as claimed in claim 1, wherein a cross section of said piezoelectric bar perpendicular to said longitudinal direction is a trapezoid.

4. A piezoelectric resonator for resonating in the length expander mode, comprising:

(a) a piezoelectric bar, having a length L, a width W, and a thickness T, wherein L>W>T; and, having first and second rectangular surfaces confronting each other in parallel and a third rectangular surface extending along the length L of said first and second rectangular surfaces, said third rectangular surface being beveled against said said first and second rectangular surfaces; and (b) electrodes formed on said first and second surfaces.

5. A piezoelectric resonator as claimed in claim 4, wherein a cross section of said piezoelectric bar perpendicular to said length L is a pentagon.

6. A piezoelectric resonator as claimed in claim 4, wherein a cross section of said piezoelectric bar perpendicular to length L is a trapezoid.

7. A ladder filter comprising: series and parallel resonators for resonating in the length expander mode, said series and parallel resonators including piezoelectric bars formed in substantial rectangular parallelepipeds, said series resonator having a resonance frequency, a first spurious resonance frequency, and a first spurious antiresonance frequency, said parallel resonator having an antiresonance frequency, a second spurious resonance frequency, and a second spurious antiresonance frequency, said resonance frequency of said series resonator substantially agreeing with said antiresonance frequency of said parallel resonator, said series resonator having a bevel portion extending said longitudinal direction of said piezoelectric bar such that said first and second spurious resonance frequencies agree with each other and said first and second spurious antiresonance frequencies agree with each other to suppress said spurious output of said ladder filter.

8. A piezoelectric resonator for resonating in length expander mode, comprising:

(a) a piezoelectric bar formed in a rectangular parallelopiped having a length L, a width W, and a thickness T wherein L>W>T; and (b) electrodes formed on a pair of confronting surfaces of said piezoelectric bar defined by said length L and thickness T, said piezoelectric bar being polarized in a direction perpendicular to said electrodes.

9. A piezoelectric resonator as claimed in claim 8, wherein said electrodes cover said first pair of confronting surfaces substantially completely.

10. A ladder filter comprising: at least a filter circuit, each filter circuit having series and parallel resonators for resonating in length expander mode, said series resonator having:

(a) a first piezoelectric bar formed in a first rectangular parallelopiped having first and second pairs of confronting surfaces with first and second distances respectively, extending in the longitudinal direction of said first piezoelectric bar; and (b) first electrodes formed on said first pair of confronting surfaces, said parallel resonator having:

(c) a second piezoelectric bar formed in a second rectangular parallelopiped having third and fourth pairs of confronting surfaces with third and fourth distances respectively, extending in the longitudinal direction of said piezoelectric bar; and (d) second electrodes formed on said fourth pair of confronting surfaces, a ratio of capacitances between said first and second electrodes being made relatively small in that said first distance is larger than said second distance and said fourth distance is smaller than said third distance.

11. A piezoelectric resonator as claimed in claim 10, wherein said electrodes cover said first pair of confronting surfaces-substantially completely.

12. A ladder filter as claimed in claim 10, wherein said first distance is substantially equal to said third distance and said second distance is substantially equal to said fourth distance.

13. A ladder filter as claimed in claim 12, wherein said series and parallel resonators being arranged on a plane such that one of said first pairs confronting surfaces and one of said third pairs of confronting surfaces contact with said plane.

14. A ladder filter as claimed in claim 12, wherein said series and parallel resonators being arranged on a plane such that one of said second pairs confronting surfaces and one of said fourth pairs of confronting surfaces contact with said plane.

15. A ladder filter comprising: series and parallel resonators for resonating in length expander mode, said series resonator including:

(a) a first piezoelectric bar formed in a first rectangular parallelopiped having a length L1, a width W1, a thickness T1 wherein L1>W1>T1; and (b) first electrodes formed on a first pair of confronting surfaces defined by said length L1 and said thickness T1, said first piezoelectric bar being polarized in a direction perpendicular to said first electrodes, said parallel resonator including:

(c) a second piezoelectric bar formed in a second rectangular parallelopiped having a length L2, a width W2, a thickness T2 wherein L2>W2>T2; and (d) second electrodes formed on a second pair of confronting surfaces defined by said length L2 and said width W2.

16. A ladder filter as claimed in claim 15, wherein said electrodes cover said first pair of confronting surfaces substantially completely.

17. A ladder filter as claimed in claim 15, wherein said width W1 is substantially equal to said width W2 and said thickness T1 is substantially equal to said T2.

18. A ladder filter as claimed in claim 17, wherein said series and parallel resonators are arranged on a flat surface of a substrate such that one of surfaces defined by said length L1 and width W1 of said first piezoelectric bar and one of surfaces defined by said length L2 and width W2 of said second piezoelectric bar contact with said flat surface.

19. A piezoelectric resonator for resonating in length expander mode, comprising:

(a) a piezoelectric bar formed in a rectangular parallelepiped having a length L, a width W, and a thickness T, said piezoelectric bar being polarized in a direction perpendicular to said longitudinal direction; and (b) electrodes formed on a pair of confronting surfaces defined by said length L and said width W, wherein W<T and 0.42<T/L<2.5.

20. A piezoelectric resonator as claimed in claim 19, wherein said piezoelectric bar formed such that 0.55<T/L<0.7.

21. A piezoelectric resonator for resonating in length expander mode, comprising:

(a) a piezoelectric bar formed in a rectangular parallelopiped having a length L, a width W, and a thickness T; and (b) electrode formed on a pair of confronting surfaces defined by said length L and said width W, wherein W<T and 0.6<T/L<0.65.

22. A ladder filter as claimed in claim 10, further comprising:

(a) a first pair of supporting and conducting blocks formed on said first electrodes at intermediate portions of said first electrodes in said longitudinal direction of said first piezoelectric bar respectively;

(b) a second pair of supporting and conducting blocks formed on said second electrodes at intermediate portions of said first electrodes in said longitudinal direction of said second piezoelectric bar respectively, said first supporting and conducting block supporting said first piezoelectric bar, said second supporting and conducting block supporting said second piezoelectric bar; and (c) a metal plate for making an electrical conduction between one of said first and one of second piezoelectric bars through one of said first and one of second supporting and conducting blocks.

23. A ladder filter comprising:

series and parallel resonators for resonating in length expander mode, wherein said series resonator includes a first piezoelectric bar formed in a first rectangular parallelopiped having a length L1, a width W1, a thickness T1 wherein L1>W1>T1, and first electrodes formed on a first pair of confronting surfaces defined by said length L1 and said thickness T1, said first piezoelectric bar being polarized in a direction perpendicular to said first electrodes, and wherein said parallel resonator includes a second piezoelectric bar formed in a second rectangular parallelopiped having a length L2, a width W2, a thickness T2 wherein L2>W2>T2, and second electrodes formed on a second pair of confronting surfaces defined by said length L2 and said width W2;

a first pair of supporting and conducting blocks formed on said first electrodes at intermediate portions of said first electrodes in said longitudinal direction of said first piezoelectric bar respectively;

a second pair of supporting and conducting blocks formed on said second electrodes at intermediate portions of said first electrodes in said longitudinal direction of said second piezoelectric bar respectively, said first supporting and conducting block supporting said first piezoelectric bar, said second supporting and conducting block supporting said second piezoelectric bar; and a metal plate for making an electrical conduction between one of said first and one of second piezoelectric bars through one of said first and one of second supporting and conducting blocks.

24. A piezoelectric resonator as claimed in claim 17, wherein said series and parallel resonators are arranged on a flat surface of a substrate such that one of surfaces defined by said length L1 and width W1 of aid first piezoelectric bar and one of surfaces defined by said length L2 and width W2 of said second piezoelectric bar contact with said flat surface, said first and second electrodes being arranged perpendicularly.

* * * * *